United States Patent
Hwang (10) Patent No.: US 7,759,156 B2
(45) Date of Patent: Jul. 20, 2010

(54) IMAGE SENSOR AND METHOD FOR MANUFACTURING THE SAME

(75) Inventor: Joon Hwang, Cheongju-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 39 days.

(21) Appl. No.: 12/333,391

(22) Filed: Dec. 12, 2008

(65) Prior Publication Data

US 2009/0174025 A1    Jul. 9, 2009

(30) Foreign Application Priority Data

Jan. 7, 2008    (KR) .................. 10-2008-001937

(51) Int. Cl.
*H01L 21/00*    (2006.01)
(52) U.S. Cl. ................ 438/67; 438/458; 257/E25.032; 257/E27.133
(58) Field of Classification Search ................... 438/65, 438/67, 69, 455, 458; 257/233, E25.032, 257/E27.133
See application file for complete search history.

(56) References Cited

U.S. PATENT DOCUMENTS 5,324,678 A * 6/1994 Kusunoki .................. 438/459

* cited by examiner

*Primary Examiner*—Quoc D Hoang
(74) *Attorney, Agent, or Firm*—Saliwanchik, Lloyd & Saliwanchik (57) ABSTRACT

An image sensor can include a first substrate, an insulating layer, a photodiode, and a via plug. A circuitry including an interconnection can be formed on the first substrate. The insulating layer is formed over the first substrate so that the insulating layer covers the interconnection. The photodiode is formed in a crystalline semiconductor layer and then bonded to the first substrate while contacting the insulating layer. The via plug is provided by removing portions of the photodiode and the insulating layer to expose an upper portion of the interconnection to form a via hole, and filling the via hole with a conductive metal. The via plug electrically connects the photodiode to the interconnection.

8 Claims, 7 Drawing Sheets

IMAGE SENSOR AND METHOD FOR MANUFACTURING THE SAME

CROSS-REFERENCE TO RELATED APPLICATION

The present application claims the benefit under 35 U.S.C. §119 of Korean Patent Application No. 10-2008-0001937, filed Jan. 7, 2008, which is hereby incorporated by reference in its entirety.

BACKGROUND

In general, an image sensor is a semiconductor device for converting an optical image into an electric signal. The image sensor may be roughly classified as a charge coupled device (CCD) image sensor or a complementary metal oxide semiconductor (CMOS) image sensor (CIS).

A CIS includes a photodiode and a MOS transistor formed in a unit pixel, and obtains an image by sequentially detecting electrical signals of unit pixels in a switching manner.

In a related art CIS structure, a photodiode and a transistor are horizontally arranged.

Although the related art horizontal type CIS has solved certain limitations of CCD image sensors, it still has several problems.

In a horizontal type CIS according to the related art, a photodiode and a transistor are horizontally formed adjacent to each other on a substrate. Therefore, an additional region for forming the photodiode is required, which may decrease the fill factor and limit the possibility of resolution.

Also, in the horizontal type CIS according to the related art, it is very difficult to achieve the optimized process of concurrently forming the photodiode and the transistor. That is, although a shallow junction is required for low sheet resistance in a rapid transistor process, it is not appropriate in a photodiode.

Furthermore, in a horizontal type CIS according to the related art, as additional on-chip functions are added to the image sensor, the size of a unit pixel must increase in order to maintain the sensitivity of the image sensor or the photodiode area must decrease in order to maintain the pixel size. However, the increase of the pixel size reduces the resolution of the image sensor, and the decrease of the photodiode area reduces the sensitivity of the image sensor.

BRIEF SUMMARY

Embodiments of the present invention relate to an image sensor and a manufacturing method thereof that can provide a new integration of a circuitry and a photodiode.

Embodiments relate to an image sensor and a manufacturing method thereof that can improve both the resolution and the sensitivity of the image sensor.

Embodiments relate to an image and a manufacturing method thereof that can provide excellent physical and electrical bonding force between a photodiode and a circuitry while employing a vertical type photodiode.

Embodiments relate to an image sensor and a manufacturing method thereof that can reduce defects inside a photodiode while employing a vertical type photodiode.

An image sensor according to an embodiment of the present invention can include: a first substrate on which a circuitry including an interconnection is formed; an insulating layer on the first substrate, the insulating layer contacting the interconnection; a photodiode bonded to the first substrate while contacting the insulating layer and being electrically connected to the interconnection; and a via plug provided by removing portions of the photodiode and the insulating layer to expose an upper portion of the interconnection to form via hole and filling the via hole with a conductive metal.

A method for manufacturing an image sensor according to an embodiment can include: preparing a first substrate on which a circuitry including an interconnection is formed; forming an insulating layer contacting the interconnection on the first substrate; preparing a second substrate on which a photodiode is formed; bonding the first substrate and the second substrate so that the photodiode and the insulating layer contact each other; removing a portion of the bonded second substrate to expose the photodiode; forming a via hole by removing a portion of the photodiode and the insulating layer so that an upper portion of the interconnection is exposed; and forming a via plug by filling the via hole with a conductive metal and removing a portion of the conductive metal.

BRIEF DESCRIPTION OF THE DRAWINGS

FIG. 1 shows a cross-section of an image sensor according to an embodiment of the present invention;

FIG. 2 shows a plan view of an image sensor according to an embodiment of the present invention; and FIGS. 3-13 show cross-sectional views for explaining a method for manufacturing an image sensor according to an embodiment of the present invention.

DETAILED DESCRIPTION

An image sensor and a method for manufacturing an image sensor in accordance with embodiments of the present invention will be described in detail with reference to the accompanying drawings.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, or one or more intervening layers may also be present. In addition, it will also be understood that when a layer is referred to as being 'between' two layers, it can be the only layer between the two layers, or one or more intervening layers may also be present.

It is to be understood that the figures and descriptions of embodiments of the present invention have been simplified to illustrate elements that are relevant for a clear understanding of the invention, while eliminating, for purposes of clarity, other elements that may be well known.

Figure 1:
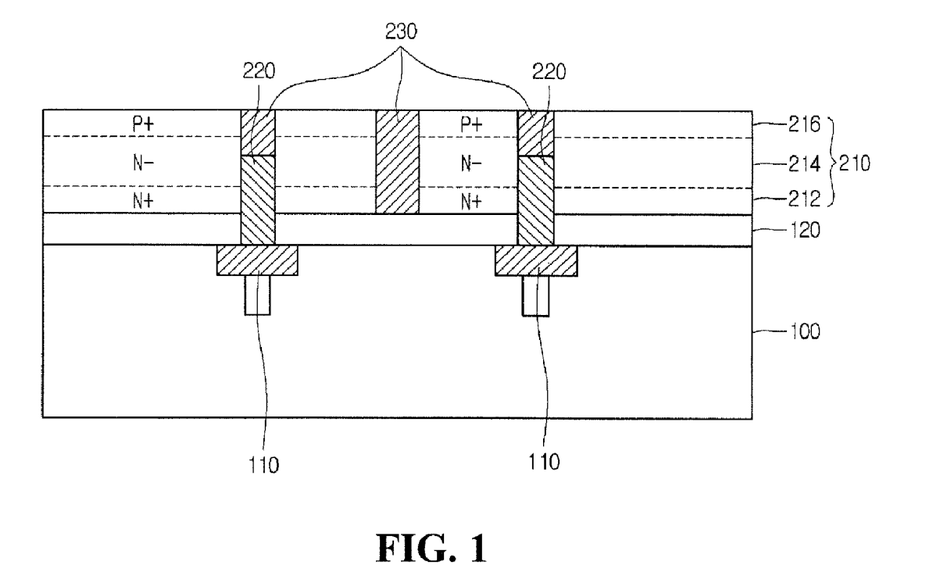
FIGS. 1 through 13 illustrate an image sensor and a method for manufacturing an image sensor in accordance with embodiments.
Figure 2:
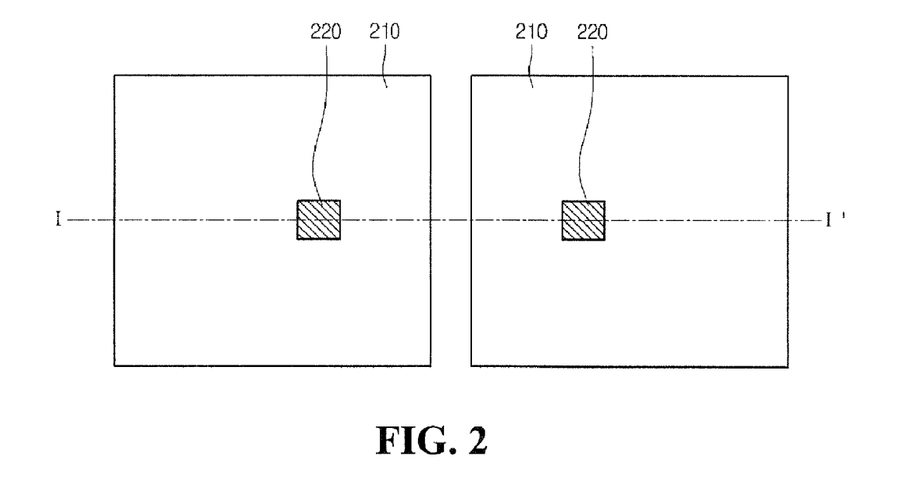

FIG. 2 shows a plan view of an image sensor in accordance with embodiments of the present invention, and FIG. 1 provides a cross-sectional view taken along line I-I' of FIG. 1 in accordance with an embodiment of the present invention.

Referring to FIGS. 1 and 2, an image sensor in accordance with an embodiment can include: a first substrate 100 having a circuitry (not shown) including interconnection 110; an insulating layer 120 on first substrate 100, the insulating layer 120 selectively contacting the interconnection 110; a photodiode 210 bonded to the first substrate 100 while contacting insulating layer 120 and electrically connected to interconnection 110; and via plug 220. The photodiode 210 can include a high-concentration first conduction type conduction layer 212, a first conduction type conduction layer 214, and a second conduction type conduction layer 216. According to an embodiment, the via plug 220 can contact the high-concentration first conduction type conduction layer 212 and the first conduction type conduction layer 214.

A bonding force between the first substrate 100 and the photodiode 210 can be increased by disposing the insulating layer 120 between the first substrate 100 and the photodiode 210. For example, the insulating layer 120 can be but is not limited to a silicon oxide layer.

Also, in accordance with embodiments, electrons generated from photodiode can be efficiently transferred to circuitry on the first substrate 100 through the via plug 220 connected to interconnection 110 from within photodiode 210.

Figure 9:
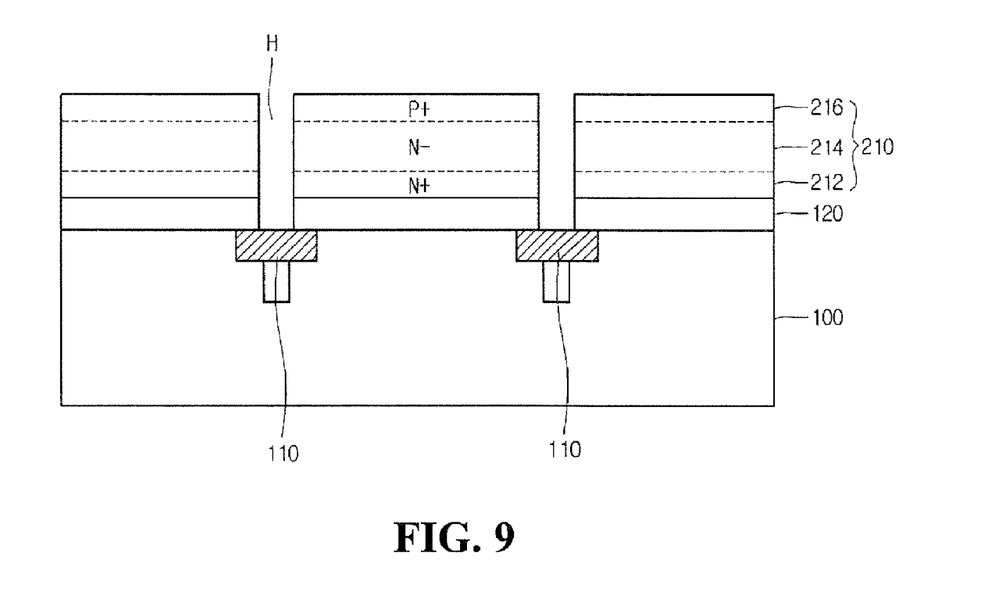

According to an embodiment, the via plug 220 can be formed by filling conductive metal into a via hole H (see FIG. 9). The via hole can be formed by selectively removing portions of the photodiode 210 and insulating layer 120 to expose the upper portion of interconnection 110.

In a specific embodiment, the photodiode 210 can include a high-concentration first conduction type conduction layer 212, a first conduction type conduction layer 214, and a second conduction type conduction layer 216. According to an embodiment, the via plug 220 can contact the high-concentration first conduction type conduction layer 212 and the first conduction type conduction layer 214. In certain embodiments, the via plug 220 does not contact the second conduction type conduction layer 216. In an embodiment, the second conduction type conduction layer 216 can be grounded (connected to a ground).

In one embodiment, the via plug 220 can be formed such that it contacts only the first conduction type conduction layer 212.

The photodiode 210 can be separated on a pixel basis. For example, the photodiode 210 can be separated according to unit pixel. In one embodiment, a second insulating layer 230 can be used to separate the photodiode 210 on a pixel basis. The second insulating layer 230 can also be formed on the via plug 220, filling the remaining portion of the via hole. The second insulating layer 230 can be but is not limited to an oxide layer.

In an embodiment, the photodiode 210 can include a first conduction type conduction layer 214 within a crystalline semiconductor layer 210a (see FIG. 4), and a second conduction type conduction layer 216 within the crystalline semiconductor layer on first the conduction type conduction layer 214. For example, the photodiode 210 can include a low-concentration N-type conduction layer 214 within the crystalline semiconductor layer 210a, and a high-concentration P-type conduction layer 216 on the low-concentration N-type conduction layer 214. However, embodiments are not limited thereto. For example, the first conduction type is not limited to N-type, but may be P-type.

Moreover, the photodiode 210 can further include a high-concentration first conduction type conduction layer 212 under first conduction type conduction layer 214 and on the insulating layer 120. For example, a high-conduction N+ type conduction layer 212 can be formed to contribute to an ohmic contact.

In an embodiment, the crystalline semiconductor layer 210a (see FIG. 4) can be but is not limited to a single crystalline semiconductor layer, and may be a polycrystalline semiconductor layer.

Although the circuitry of first substrate 100 is not illustrated, any suitable CIS circuitry can be utilized. For example, the circuitry can be arranged as a four transistor (4 Tr) CIS. In other embodiments, for example, 1 Tr CIS, 3 Tr CIS, 5 Tr CIS or 1.5 Tr CIS (transistor shared CIS) configurations can be used.

The interconnection 110 on first substrate 100 can include a metal (not shown) and a plug (not shown). In addition, the interconnection 110 can be formed of multiple layers. The uppermost portion of interconnection 110 can act as a lower electrode of the photodiode.

In a further embodiment, a top metal (not shown) can be further formed on the photodiode 210. In yet a further embodiment, a color filter can be formed above the photodiode 210.

FIGS. 3 through 13 are cross-sectional views illustrating a method for manufacturing an image sensor in accordance with embodiments.

Figure 3:
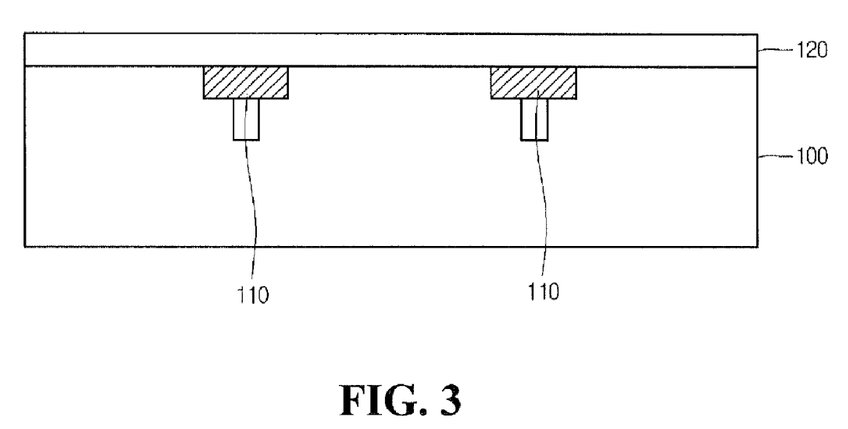

Referring to FIG. 3, a first substrate 100 on which interconnection 110 and a circuitry (not shown) are formed is prepared. Although the circuitry of the first substrate 100 is not illustrated, the circuitry can be any suitable transistor configuration. For example, a four transistor configuration (4 Tr CIS) may be utilized, but embodiments are not limited thereto.

The interconnection 110 can include metal layers connected by plugs.

Next, an insulating layer 120 can be formed on the first substrate 100 covering the interconnection 110.

In accordance with embodiments, a bonding force between the first substrate 100 and the photodiode 210 can be increased by forming the insulating layer 120 between the first substrate 100 and the photodiode 210. In an embodiment, the insulating layer 120 can be but is not limited to a silicon oxide layer.

Figure 4:
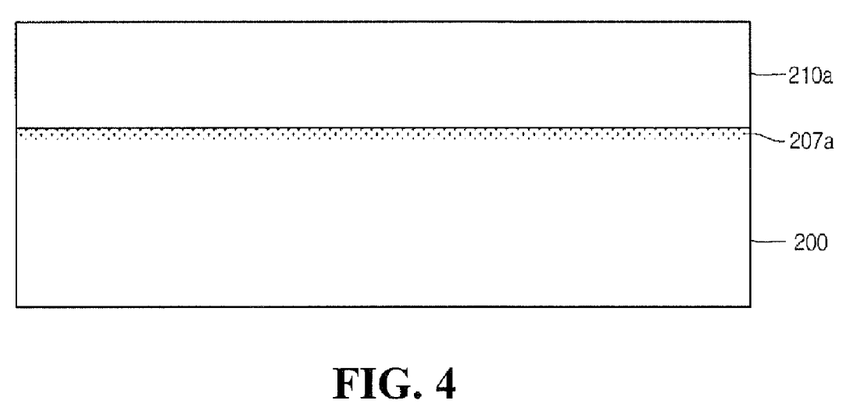

Referring to FIG. 4, a crystalline semiconductor layer 210a can be formed on second substrate 200. By forming a photodiode 210 in a crystalline semiconductor layer 210a, defects within the photodiode 210 can be reduced.

In an embodiment, the crystalline semiconductor layer 210a can be epitaxially formed on the second substrate 200. Then, a hydrogen ion implantation layer 207a can be formed by implanting hydrogen ions into a boundary between the second substrate 200 and the crystalline semiconductor layer 210a. The implantation of the hydrogen ions can alternatively be performed after ion implantation for forming the photodiode 210.

Figure 5:
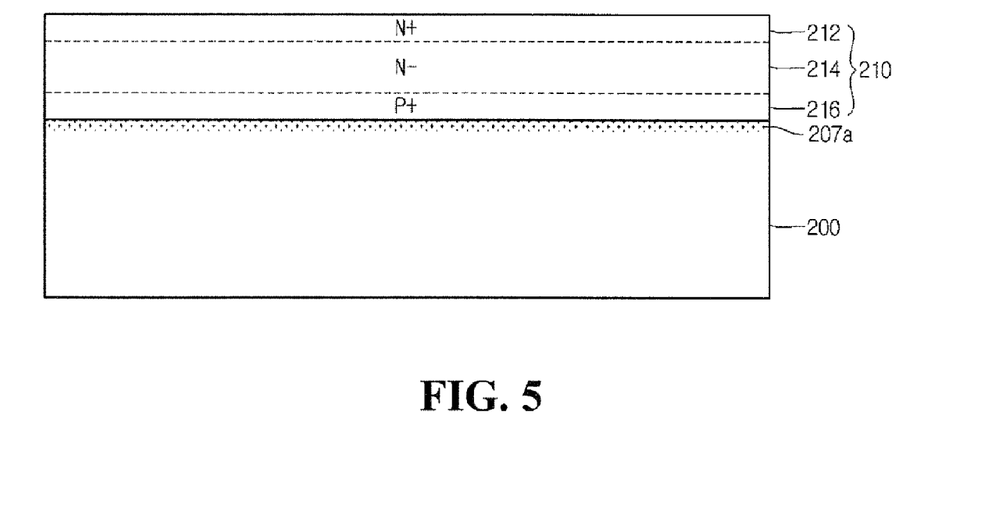

Referring to FIG. 5, a photodiode 210 can be formed by implanting ions into the crystalline semiconductor layer 210a.

For example, a second conduction type conduction layer 216 can be formed in a lower portion of the crystalline semiconductor layer 210a. A high-concentration P-type conduction layer 216 can be formed in the lower portion of the crystalline semiconductor layer 210a by implanting ions over the second substrate 200 in a blanket manner without mask. For example, the second conduction type conduction layer 216 may have a junction depth of less than about 0.5 μm.

After that, a first conduction type conduction layer can be formed on the second conduction type conduction layer 216. A low-concentration N-type conduction layer 214 can be formed on the second conduction type conduction layer 216 by implanting ions over the second substrate 200 in a blanket manner without mask. For example, the low-concentration first conduction type conduction layer 214 may be formed to have a junction depth in a range of about 1.0-2.0 μm.

Embodiments can further include forming high-concentration first conduction type conduction layer 212 on the first conduction type conduction layer 214. For example, a high-concentration N+ type conduction layer 212 can be formed on the first conduction type conduction layer by implanting ions over the second substrate in a blanket manner without mask, thereby contributing to an ohmic contact.

Figure 6:
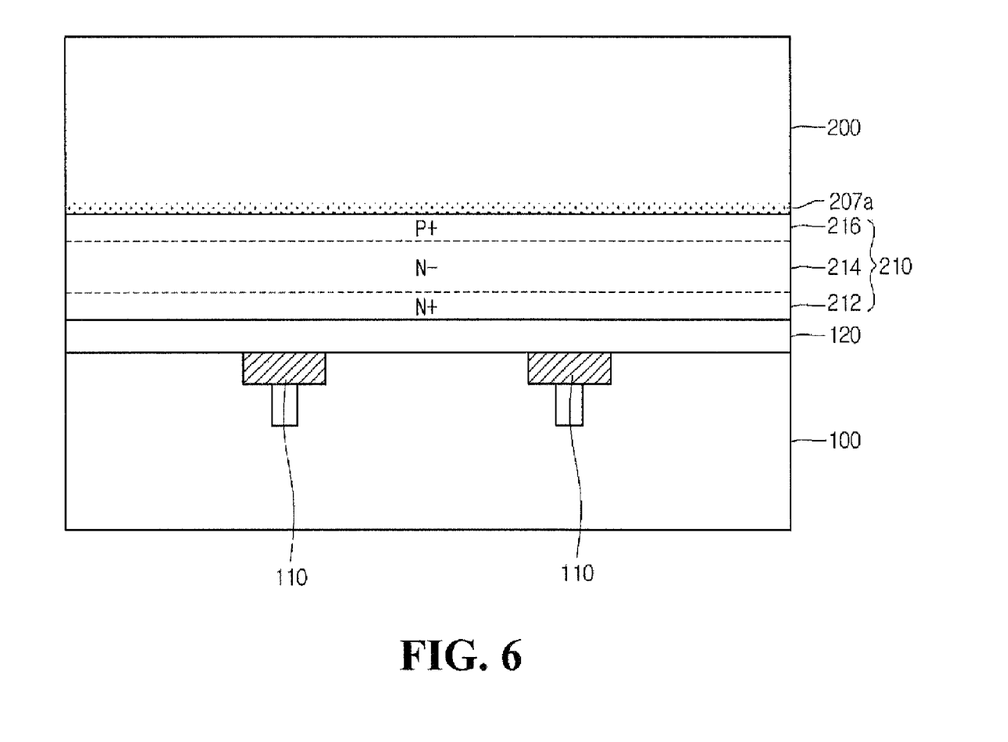

Referring to FIG. 6, the first substrate 100 and the second substrate 200 are bonded together to contact the photodiode 210 with the insulating layer 120. In an embodiment, before bonding the first substrate 100 to the second substrate 200, the bonding may be performed by increasing surface energy of a surface bonded by activation due to plasma.

Figure 7:
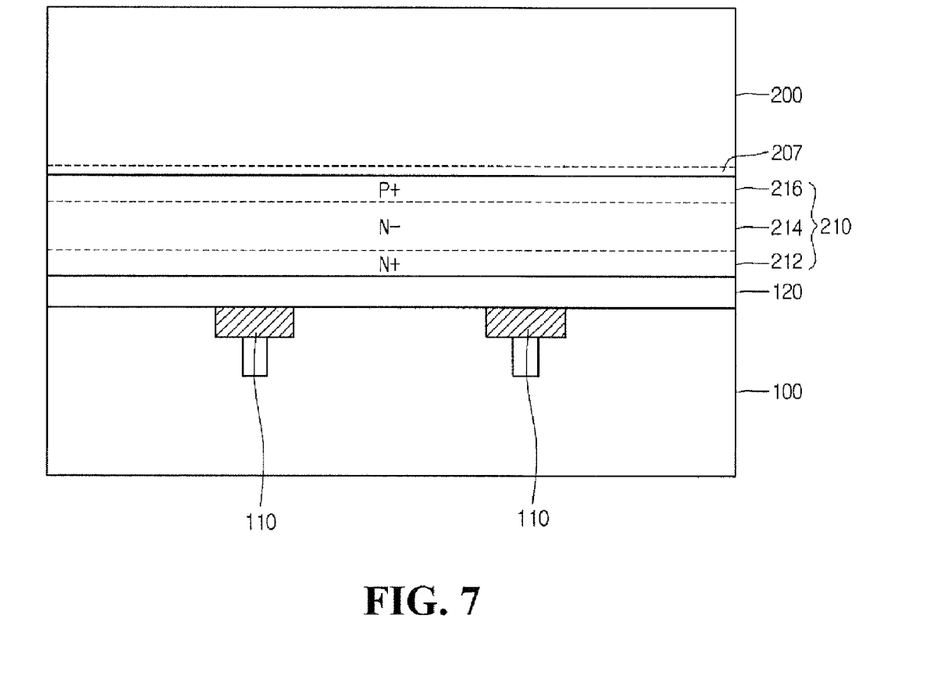

Referring to FIG. 7, the hydrogen ion implantation layer 207a can be changed to a hydrogen gas layer 207 by performing a thermal treatment with respect to the second substrate 200.

Figure 8:
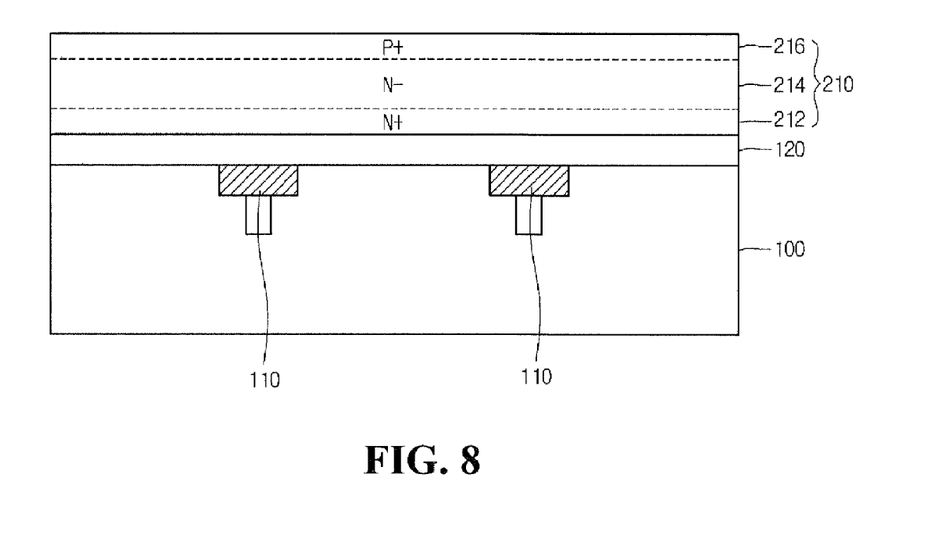

Referring to FIG. 8, a portion of the second substrate 200 with reference to hydrogen gas layer 207 may be removed using a blade to expose the photodiode 210.

Next, a via plug 220 to be connected to interconnection 110 is formed within photodiode 210.

For example, referring to FIG. 9, a via hole H is formed by selectively removing portions of the photodiode 210 and the insulating layer 120 by using a photoresist pattern (not shown) as an etch mask to expose the upper portion of the interconnection 110.

Figure 10:
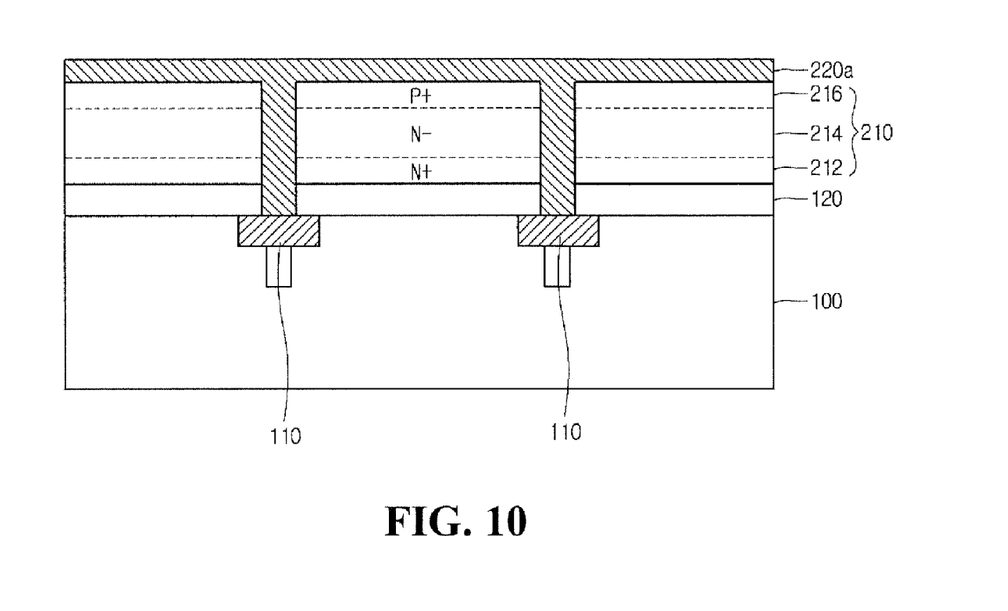

Referring to FIG. 10, the photoresist pattern (not shown) is removed and the via hole H is filled with conductive metal 220a. The conductive metal 220a can be but is limited to tungsten (W). In another embodiment, the via hole H can be filled with the conductive metal 220a without removing the photoresist pattern.

Figure 11:
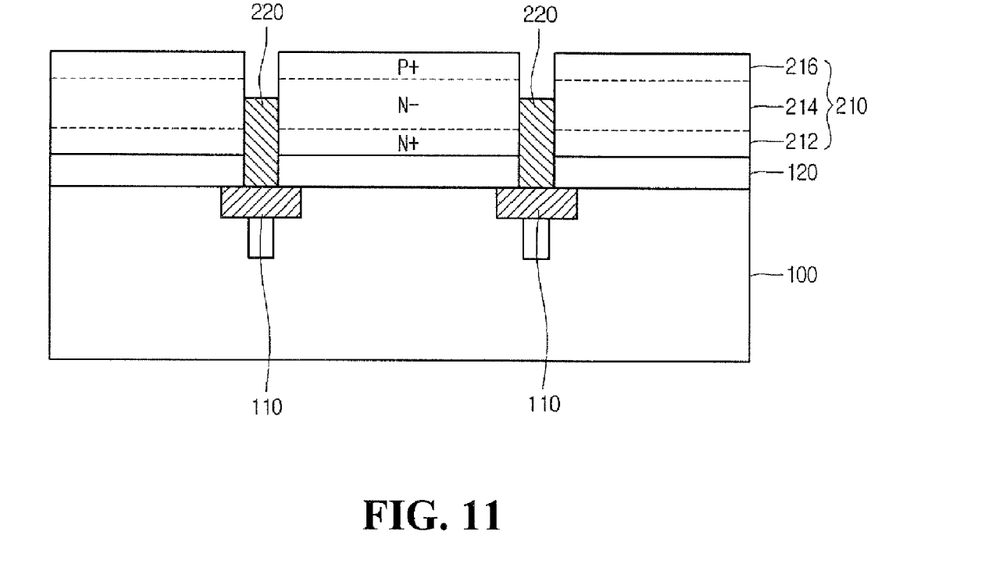

Referring to FIG. 11, the conductive metal 220a can be selectively removed to form a via plug 220. For example, the via plug 220 can be formed by performing an etch-back process on the conductive metal 220a. Before the etch-back process, a planarization process such as a CMP (chemical mechanical polishing) can be further performed. The etch-back process can use a material having a high selectivity of crystalline semiconductor layer 210a (of the photodiode 210) to the conductive metal 220a.

Furthermore, the via plug 220 can be formed by etching the upper portion of conductive metal 220a using the photoresist pattern as a mask in embodiments where the photoresist pattern is not removed after forming the via holes.

In accordance with embodiments, the process of forming a via plug 220 can have the following features. That is, when the photodiode 210 includes a high-concentration first conduction type conduction layer 212, a first conduction type conduction layer 214, and a second conduction type conduction layer 216, the via plug 220 can contact the high-concentration first conduction type conduction layer 212 and the first conduction type conduction layer 214, while not contacting the second conduction type conduction layer 216. Also, the second conduction type conduction layer 216 may be grounded.

Figure 12:
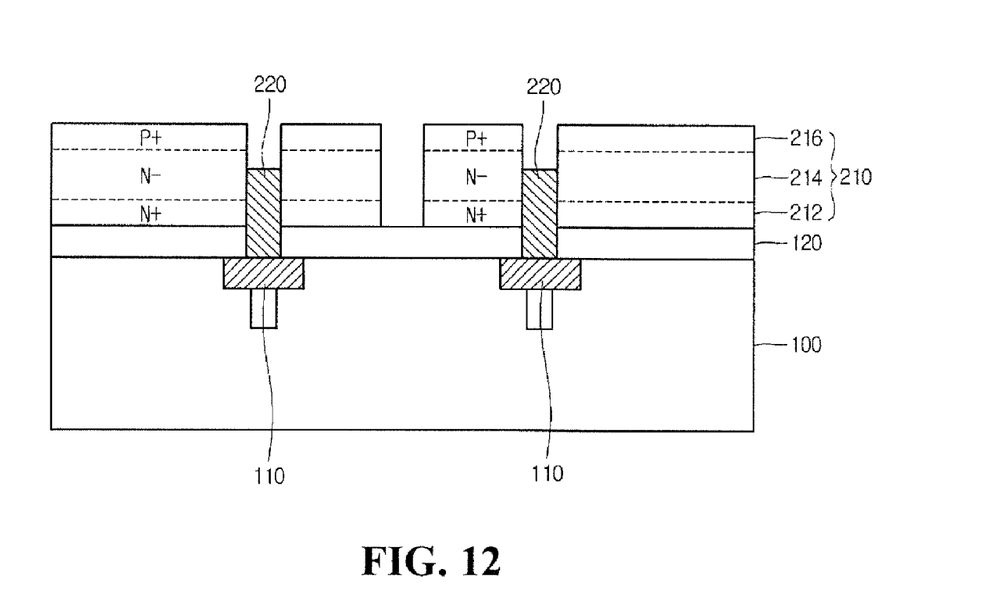

In accordance with another embodiment, the via plug 220 can be formed to contact only the high-concentration first conduction type conduction layer 212. Referring to FIG. 12, an etching process can be performed such that the photodiode 210 having the via plug 220 can be separated on a pixel basis.

For example, portions of the crystalline semiconductor layer of the photodiode 210 at a pixel boundary can be selectively removed to expose the insulating layer 120.

Figure 13:
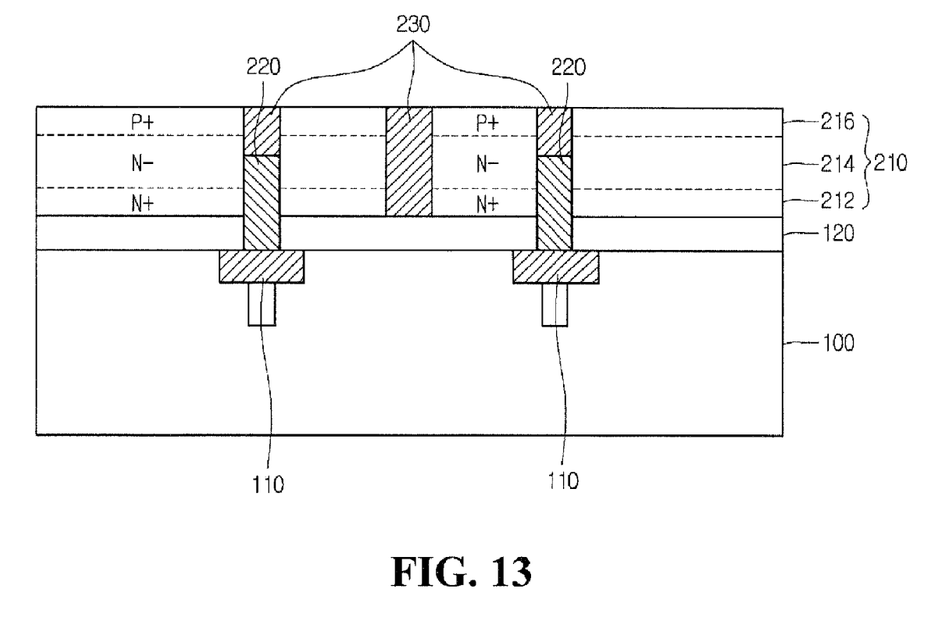

Referring to FIG. 13, the etched portion can be filled with a second insulating layer 230. For example, the photodiode 210 can be separated on a pixel basis by the second insulating layer. In this case, the second insulating layer 230 can also be formed on the via plug 220. The second insulating layer 230 can be but is not limited to an oxide layer.

After that, a process of forming an upper electrode (not shown) and a color filer (not shown) may be performed.

The method for manufacturing the image sensor in accordance with embodiments can provide a vertical integration of the circuitry and the photodiode.

In addition, the substrate on which the photodiode is formed and the substrate on which the circuitry is formed can be firmly attached by disposing the insulating layer therebetween.

Furthermore, electrons generated from the photodiode can be efficiently transferred to the circuitry by further forming the via plug connected to the interconnection of the circuitry inside the photodiode.

Moreover, defects inside the photodiode can be reduced by forming the photodiode inside the crystalline semiconductor layer while employing the vertical type photodiode where the photodiode is disposed on the circuitry.

Although embodiments relate generally to a complementary metal oxide semiconductor (CMOS) image sensor, such embodiments are not limited to the same and may be readily applied to any image sensor requiring a photodiode.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for manufacturing an image sensor, comprising:
    preparing a first substrate on which a circuitry including an interconnection is formed;
    forming an insulating layer contacting the interconnection over the first substrate;
    preparing a second substrate on which a photodiode is formed;
    bonding the first substrate and the second substrate so that the photodiode and the insulating layer contact each other;
    removing a portion of the bonded second substrate to expose the photodiode;
    forming a via hole by selectively removing the exposed photodiode and the insulating layer so that an upper portion of the interconnection is exposed;
    filling the via hole with a conductive metal; and
    removing a portion of the conductive metal in the via hole to form a via plug in a portion of the via hole.

2. The method according to claim 1, wherein the preparing of the second substrate on which the photodiode is formed comprises forming a photodiode comprising a high-concentration first conduction type conduction layer, a first conduction type conduction layer, and a second conduction type conduction layer.

3. The method according to claim 2, wherein removing the portion of the conductive metal in the via hole comprises removing the conductive metal in the via hole that contacts the second conduction type conduction layer.

4. The method according to claim 3, wherein removing the portion of the conductive metal in the via hole further comprises removing the conductive metal in the via hole that contacts at least a portion of the first conduction type conduction layer.

5. The method according to claim 2, further comprising, after forming the via plug, forming a second insulating layer filling the via hole to contact the via plug and the second conduction type conduction layer of the photodiode.

6. The method according to claim 1, wherein the insulating layer comprises a silicon oxide layer.

7. The method according to claim 1, further comprising, after forming the via hole, separating the photodiode on a pixel basis.

8. The method according to claim 7, wherein separating the photodiode on a pixel basis comprises selectively etching the photodiode at regions corresponding to pixel boundaries and filling the etched regions with a second insulating layer.

* * * * *